United States Patent [19]

Vossen, Jr. et al.

[11] 3,984,907

[45] Oct. 12, 1976

[54] ADHERENCE OF METAL FILMS TO POLYMERIC MATERIALS

[75] Inventors: John Louis Vossen, Jr., Bridgewater, N.J.; Frederick Russell Nyman, Carmel; George Frederick Nichols, Oaklandon, both of Ind.

[73] Assignee: RCA Corporation, New York, N.Y.

[22] Filed: July 25, 1975

[21] Appl. No.: 599,130

[52] U.S. Cl. .................................. 29/195; 29/199
[51] Int. Cl.² .................... B32B 15/08; B32B 15/20
[58] Field of Search ............ 29/195 P, 199; 75/171; 178/6.6 R, 6.6 A; 179/100.1 B

[56] References Cited
UNITED STATES PATENTS

| | | | |
|---|---|---|---|
| 3,558,290 | 1/1971 | Baier et al. ......................... 29/195 |
| 3,842,194 | 10/1974 | Clemens ......................... 178/6.6 A |
| 3,842,217 | 10/1974 | Clemens........................ 179/100.1 B |
| 3,843,399 | 10/1974 | Kaplan et al...................... 178/6.6 R |
| 3,901,994 | 8/1975 | Mehalso et al............... 179/100.1 B |
| 3,909,517 | 9/1975 | Clemens ......................... 178/6.6 A |

*Primary Examiner*—L. Dewayne Rutledge
*Assistant Examiner*—E. L. Weise
*Attorney, Agent, or Firm*—Glenn H. Bruestle; Birgit E. Morris

[57] ABSTRACT

The addition of copper, either as a thin film or as an alloy constituent, to nickel-chromium alloys improves the adhesion of such alloys to polymeric substrates and coatings.

6 Claims, No Drawings

ADHERENCE OF METAL FILMS TO POLYMERIC MATERIALS

REFERENCE TO RELATED APPLICATIONS

An application of Vossen et al. "Improved Metal Coating for Video Discs" Ser. No. 599,128 and of Nyman et al. "Improved Metal Coating for Video Discs" Ser. No. 599,129 filed concurrently herewith, describe an extension of the subject matter described herein.

This invention relates to a method for improving adhesion of metal films to polymeric materials, and to novel alloys obtained thereby.

BACKGROUND OF THE INVENTION

Thin films of conductive and/or decorative metals, particularly transition metals or their alloys, can be only selectively applied to polymeric substrates or coated with polymeric films because of the lack of adhesion of most metals to polymers. In general, the surface of the polymer must be modified, as by oxidation, roughening, and the like, or an intermediate adhesion-promoting agent must be applied to the polymer or metal surface which adds to the cost and sometimes detracts from the appearance of such laminates. The use of thin metal films as decorative and durable coatings for toys, auto accessories and the like would increase if a method could be found to coat polymeric substrates with strongly adherent, metallic films.

SUMMARY OF THE INVENTION

We have found that copper improves the adhesion of nickel and chromium alloy thin films to polymeric substrates and coatings. The copper can be applied as a very thin film between the polymeric material and the metal to be deposited, or can be first admixed with the metal to be deposited as an alloy constituent. The greater the amount of copper added, the greater the adhesion provided, but a film as little as about 25 angstroms thick at the polymer-metal interface or the addition of as little as about 10 atomic percent of copper to an alloy composition, improves metal-polymer adhesion by several orders of magnitude.

DETAILED DESCRIPTION OF THE INVENTION

The present invention will be described particularly with respect to the preparation of a metallized vinyl disc as described by Clemens in U.S. Pat. Nos. 3,842,194 and 3,842,217 incorporated by reference herein, but it will be readily understood that the invention has applicability to other polymeric substrates and coatings as well as other metals.

The metal alloys useful herein are alloys of nickel and chromium which can contain up to about 10 percent by weight of iron. Particularly useful alloys contain from about 65 to about 80 weight percent of nickel, about 10 to about 30 weight percent of chromium and from 0 to about 10 weight percent of iron.

When copper is to be added to the above-described alloys, the copper must be added in sufficient amounts to impart adherence of the resultant alloy both to polymeric substrates and to polymeric coatings. For improved adherent coatings, from about 10 to about 15 atomic percent of copper is added to the alloy. Alternatively, a layer from about 25 to about 50 angstroms thick of copper can be deposited between the polymer-alloy interface.

According to one method of preparing the present films, the polymeric substrate to be coated with a conductive adherent metal film is placed in a vacuum chamber and connected to a positive source of current, such as a planar magnetron source. The vacuum chamber is also fitted with a negative electrode of copper and another electrode of the nickel-chromium alloy to be deposited. The chamber is then evacuated to a pressure of about $5 \times 10^{-6}$ to $3 \times 10^{-5}$ torr and a small amount of an inert gas, such as argon, is fed into the chamber to a pressure of up to about 15 millitorr. The pressure is not critical however, and can vary from about 2 to about 100 millitorr.

When a planar magnetron is employed in the chamber as a source of current, the voltage can be varied from about 300 to 1,000 volts and the current can be up to 10 amperes, depending upon the rate of deposition desired and the size of the electrode.

The copper electrode is activated first to initiate sputtering on the substrate and is continued until a thin layer of about 25 to 50 angstroms of copper is deposited. The current to the copper electrode is then discontinued and the nickel-chromium alloy electrode is activated so as to sputter a layer of alloy of the desired thickness, generally from about 200 to about 400 angstroms thick. In the event that a polymeric coating is to be deposited over the nickel-chromium alloy, a third layer, also of copper, can also be deposited over the nickel-chromium alloy to provide a thin film of copper between the metal-polymeric coating interface.

Thin copper films have excellent adhesion to polymeric substrates, particularly vinyl, and they also adhere well to nickel-chromium alloy layers and to polymeric coatings, particularly styrene polymer coatings. Thus, the purpose of the copper layers is to provide good adhesion of the conductive and/or decorative metal layer both to a polymeric substrate and to a polymeric dielectric layer subsequently applied if desired.

Copper can also be cosputtered with the nickel-chromium alloy in a similar vacuum chamber, except providing an electrode of a nickel-chromium alloy in which pure copper has been inserted into spaces cut for that purpose. The size and location of the copper in the electrode is chosen to deposit the amount of copper desired onto the substrate to be coated. The current to the single alloy-copper electrode is then turned on and sputtering is continued until a layer generally about 200 to 400 angstroms thick, has been deposited onto the substrate.

The exact mechanism of the improved adhesion of the present metal films is unknown, but it is presently believed that the copper serves to stress relieve the nickel-chromium alloy film. As determined by electron spectroscopy for chemical analysis, no chemical bonding between the copper-containing layer and/or the polymeric substrate or coating is involved.

The invention will be further illustrated by the following examples, but it is to be understood that the invention is not meant to be limited to the details described therein. In the examples, all parts and percentages are by weight unless otherwise noted.

EXAMPLE I

A vacuum chamber was fitted with two planar magnetron sputtering cathodes, one made of copper and the other of Inconel-600, an alloy containing $76.8 \pm 3\%$ of nickel, 13.8 ± 3% of chromium, and 8.5 ± 2% of iron (plus minor amounts of impurities). Both cathodes were 8.25 × 3.56 inches (20.96 × 9.04 cm) in size. A vinyl video disc 12 inches (30.48 cm) in diameter was suspended about 2 inches (5.08 cm) above the electrodes and rotated at 40 rpm.

The chamber was evacuated to a pressure of $3 \times 10^{-5}$ torr and backfilled through a value to a pressure of about 15 millitorr with argon.

The copper electrode was activated with 360 volts, 0.3 amperes of current. The average deposition rate on the record under these conditions was about 80 to 100 angstroms per minute. Copper deposition was continued for about 30 seconds or until a layer of about 50 angstroms thick of copper had been deposited, when this electrode was inactivated.

The Inconel-600 electrode was then activated with 650 volts, 1.5 amperes of current, resulting in a deposition rate of about 330 to 400 angstroms per minute. Deposition was continued for about 30 seconds or until a layer of about 200 angstroms thick had been deposited, when the electrode was inactivated.

The copper electrode was then reactivated to apply another layer of copper about 50 angstroms thick over the Inconel-600 layer.

The metal film was tested for adhesion by storing for 120 hours at 90° F and 90% RH in air and applying scotch tape to the surface. No film was removed when the scotch tape was pulled off.

Stress measurements were made in known manner by depositing films as above on very thin aluminum oxide discs and noting the bending of the discs microscopically. Whereas a film of Inconel-600 about 225 angstroms thick had a compressive stress of $30 \times 10^9$ dynes/cm$^2$, a trilayer coated disc prepared as above had a compressive strength of only $6 \times 10^9$ dynes/cm$^2$.

EXAMPLE II

The procedure of Example I was followed except that a sputtering electrode was prepared of Inconel-600 in which two slots were machined 0.252 inch × 6 inches (0.64 × 15.24 cm) in size, the first one 1.225 inches (3.11 cm) from and parallel to one of the long edges of the electrode, and the other 1.245 inches (3.16 cm) from and parallel to the other long edge of the electrode. A one-fourth inch (0.64 cm) wide copper bar the length of the slot was fitted into the slot so that the edge was flush with the electrode surface. These dimensions were chosen so that the center line of one of the copper bars is in the center of one eroded or sputtered track and the other bar is on the inside edge of the second track in the electrode.

The chamber was evacuated to a pressure of about $3 \times 10^{-6}$ torr and backfilled with argon to a total pressure of $1.5 \times 10^{-2}$ torr.

The electrode was then activated with 650 volts and 1.5 amperes of current, resulting in a deposition rate of about 330 to 400 angstroms per minute. Deposition was continued for about 30 seconds or until a layer about 200 angstroms thick had been deposited.

The resultant metal film was tested for adhesion by the scotch tape test as in Example I. No film was removed when the scotch tape was pulled off.

The compressive stress of this metal film, measured according to the procedure of Example I, was only $5 \times 10^{-9}$ dynes/cm$^2$.

The metal coated vinyl disc as prepared above was coated with a polymer of styrene as follows: a vacuum chamber fitted as above was evacuated to a pressure of about $3 \times 10^{-3}$ torr and backfilled with nitrogen to a pressure of about 8 to $10 \times 10^{-3}$ torr. Styrene monomer was then added to a pressure of 13 to $15 \times 10^{-3}$ torr. The metal coated disc was suspended about 2 inches (5.08 cm) above a planar magnetron source having an electrode 3.5 × 7 inches (8.9 × 17.8 cm) in size at a power supply frequency of about 10 kilohertz and a voltage of 680 volts. The power was turned on for 30 seconds and the disc was lowered to face the electrode and rotated at about 40 rpm for 2 minutes so as to deposit a styrene polymer film about 350 angstroms thick.

Compressive stress for the resultant film was only $3 \times 10^9$ dynes/cm$^2$.

We claim:
1. A laminate of a film from about 25 to about 50 angstroms thick of copper, a layer of an alloy of chromium and nickel which can contain up to about 10 percent by weight of iron from about 200 to about 400 angstroms thick and a film of copper about 25 to about 50 angstroms thick wherein said copper films are disposed on either side of said alloy layer.

2. A laminate according to claim 1 wherein said alloy contains from about 65 to about 80 percent by weight of nickel, from about 10 to about 30 percent by weight of chromium and from 0 to about 10 percent by weight of iron.

3. An article of a laminate according to claim 1 wherein said laminate is disposed on a polymeric substrate.

4. An article according to claim 3 wherein said substrate is of vinyl.

5. An article according to claim 3 wherein said laminate has a polymeric coating disposed thereon.

6. An article according to claim 5 wherein said coating is a polymer of styrene.

* * * * *